(12) United States Patent
Kato et al.

(10) Patent No.: US 10,049,978 B2
(45) Date of Patent: Aug. 14, 2018

(54) SEMICONDUCTOR MODULE

(71) Applicant: KABUSHIKI KAISHA TOYOTA JIDOSHOKKI, Aichi-ken (JP)

(72) Inventors: Naoki Kato, Kariya (JP); Shogo Mori, Kariya (JP); Harumitsu Sato, Kariya (JP); Hiroki Watanabe, Kariya (JP); Hiroshi Yuguchi, Kariya (JP); Koji Nishimura, Kariya (JP)

(73) Assignee: KABUSHIKI KAISHA TOYOTA JIDOSHOKKI, Aichi-Ken (JP)

( * ) Notice: Subject to any disclaimer, the term of this patent is extended or adjusted under 35 U.S.C. 154(b) by 0 days.

(21) Appl. No.: 15/635,922

(22) Filed: Jun. 28, 2017

(65) Prior Publication Data

US 2018/0012833 A1    Jan. 11, 2018

(30) Foreign Application Priority Data

Jul. 8, 2016  (JP) ................................. 2016-135931

(51) Int. Cl.
 *H01L 23/00* (2006.01)
 *H01L 23/057* (2006.01)
 (Continued)

(52) U.S. Cl.
 CPC ............ *H01L 23/50* (2013.01); *H01L 23/057* (2013.01); *H01L 23/16* (2013.01); *H01L 24/83* (2013.01); *H01L 25/0655* (2013.01); *H01L 2224/40137* (2013.01); *H01L 2224/83908* (2013.01); *H01L 2224/83951* (2013.01); *H01L 2224/83986* (2013.01)

(58) Field of Classification Search
 CPC ... H01L 23/293; H01L 23/50; H01L 25/0655; H01L 25/072; H01L 23/52; H01L 24/01; H01L 23/16; H01L 23/3675
 See application file for complete search history.

(56) References Cited

U.S. PATENT DOCUMENTS 7,141,741 B2   11/2006  Yamada et al.
2014/0048918 A1*  2/2014  Nagaune ............ H01L 23/4334
                                                               257/675

(Continued)

FOREIGN PATENT DOCUMENTS

JP   59-208736   11/1984

OTHER PUBLICATIONS

Official Communication issued in counterpart European Patent Office (EPO) Patent Application No. 17178953.0, dated Nov. 27, 2017.

*Primary Examiner* — Jasmine Clark
(74) *Attorney, Agent, or Firm* — Greenblum & Bernstein, P.L.C.

(57) ABSTRACT

A semiconductor module includes a wiring substrate and two semiconductor devices mounted on the wiring substrate. The semiconductor module includes a housing having a rectangular frame body including four side walls. The housing includes a beam that bridges first side walls. A bus bar includes two end portions, upright portions each extending from one of the end portions in the thickness direction of an insulating substrate, bent portions each extending continuously with one of the upright portions, and an extension extending continuously with the bent portions. A section of the extension is embedded in the housing.

7 Claims, 4 Drawing Sheets

(51) Int. Cl.
*H01L 23/16* (2006.01)
*H01L 23/50* (2006.01)
*H01L 25/065* (2006.01)

(56) References Cited

U.S. PATENT DOCUMENTS

2016/0126154 A1* 5/2016 Hoehn .................. H01L 23/053
257/693
2016/0141214 A1 5/2016 Sato

* cited by examiner

SEMICONDUCTOR MODULE

BACKGROUND OF THE INVENTION

The present invention relates to a semiconductor module.

A semiconductor module having semiconductor devices to which a bus bar is joined is disclosed in, for example, Japanese Laid-Open Patent Publication No. 59-208736. The semiconductor module disclosed in the publication includes a bus bar integrated with a case. In this configuration, the case is positioned when the bus bar is joined to the semiconductor devices. At this time, the bus bar, which is integrated with the case, is also positioned. In this state, the bus bar is joined to the semiconductor devices.

In the semiconductor module disclosed in the aforementioned publication, the semiconductor devices are accommodated in a housing before the bus bar is joined. This prevents the joint portions of the bus bar from being visually checked.

SUMMARY OF THE INVENTION

Accordingly, it is an objective of the present invention to provide a semiconductor module that allows the joint portions of a bus bar to be visually checked even after attachment of the housing.

To achieve the foregoing objective and in accordance with one aspect of the present invention, a semiconductor module is provided that includes a wiring substrate having a wiring trace arranged on an insulating substrate, a semiconductor device connected to the wiring trace, a plate-shaped bus bar having at least one end portion joined to the wiring trace or the semiconductor device, and a plastic housing having a frame body surrounding the wiring trace and the semiconductor device, the bus bar being integrated with the housing. The bus bar includes an upright portion that extends upright from the end portion in a thickness direction of the insulating substrate, a bent portion that extends continuously with the upright portion and bends the bus bar in a direction crossing the thickness direction, and an extension that extends continuously with the bent portion and has a section embedded in the housing. The housing includes an opening for visual checking at a position corresponding to a joint portion between the end portion of the bus bar and the wiring trace or the semiconductor device.

Other aspects and advantages of the present invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which.

DETAILED DESCRIPTION OF THE PREFERRED EMBODIMENTS

A semiconductor module according to one embodiment of the present invention will now be described with reference to FIGS. 1 to 4. In the following description, X, Y, and Z directions are defined as represented in FIGS. 1 to 8. Also, the Z direction is defined as a vertical direction in the description below.

Figure 1:
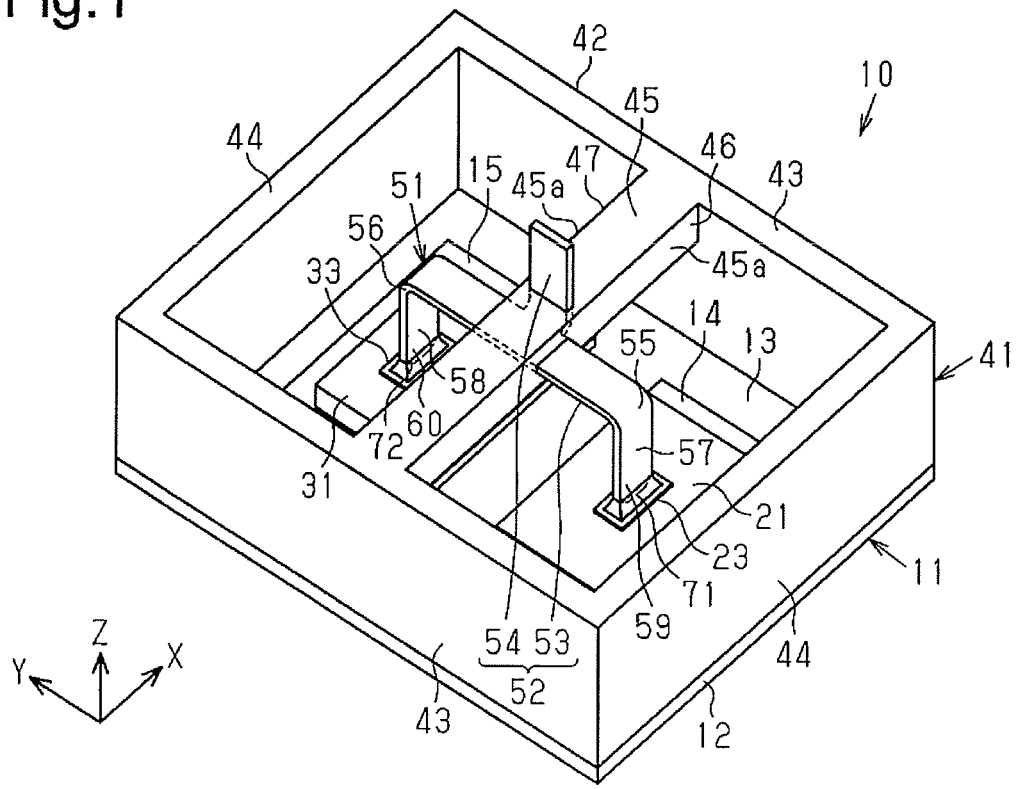
FIG. 1 is a perspective view showing a semiconductor module according to one embodiment of the present invention, illustrating a state from which potting resin is omitted.
Figure 2:
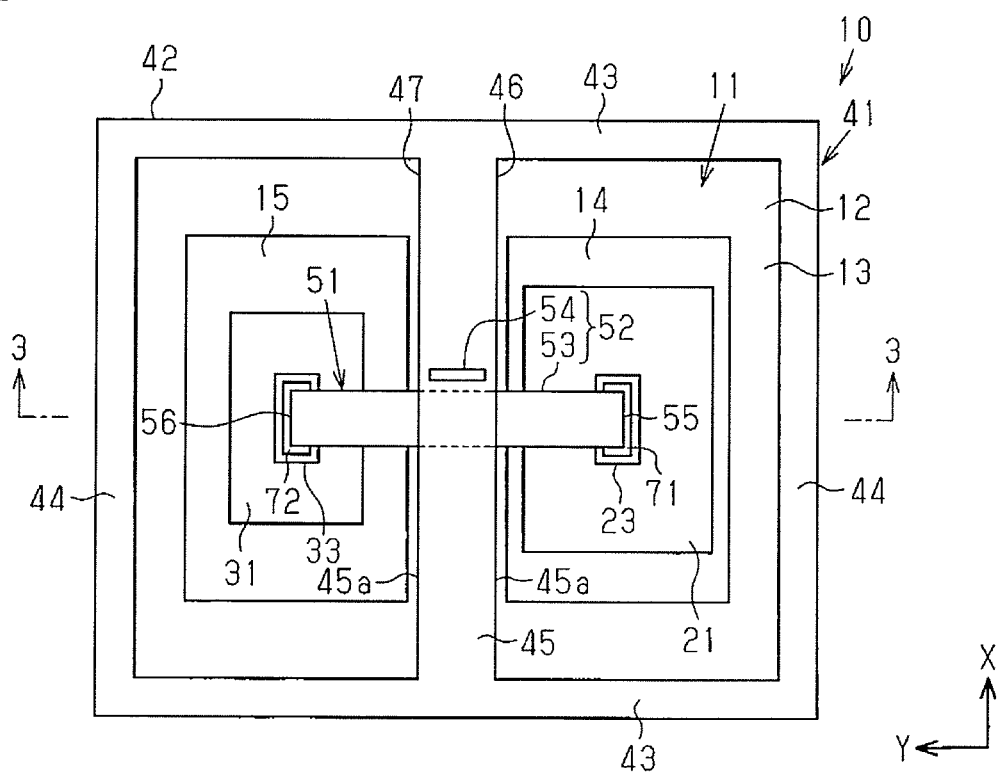
FIG. 2 is a plan view showing the semiconductor module, illustrating a state from which potting resin is omitted.

As illustrated in FIGS. 1 and 2, a semiconductor module 10 includes a wiring substrate 11 and two semiconductor devices 21, 31, which are mounted on the wiring substrate 11. The wiring substrate 11 includes an insulating substrate 12 and wiring traces 14, 15, which are arranged on an upper surface 13 of the insulating substrate 12. Each of the wiring traces 14, 15 is located at a position corresponding to one of the semiconductor devices 21, 31. The semiconductor devices 21, 31 are made of, for example, silicon (Si) or silicon carbide (SiC).

Figure 3:
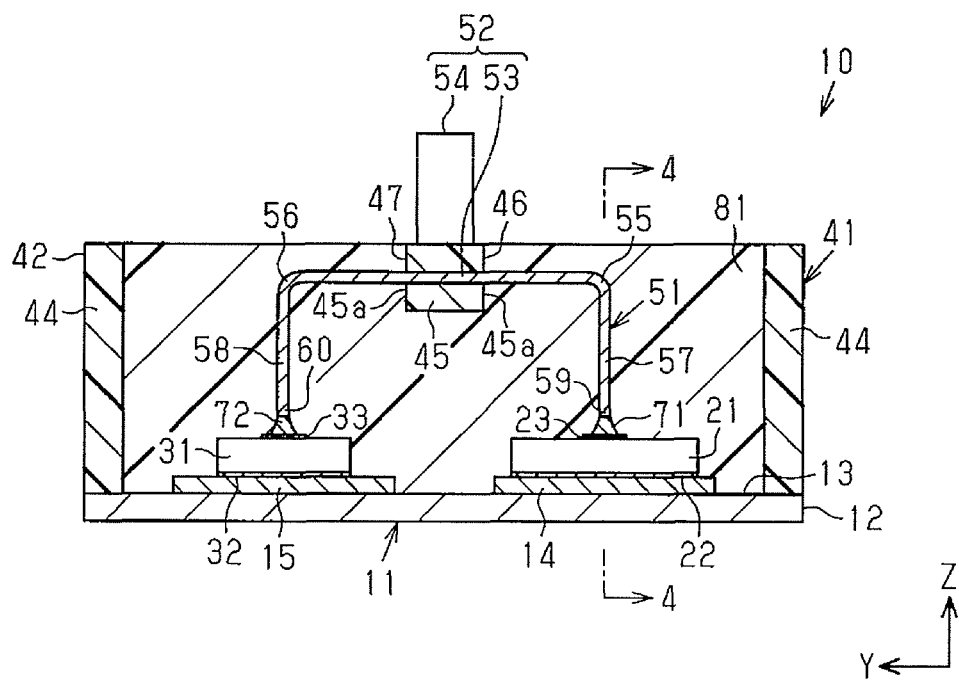
FIG. 3 is a cross-sectional view taken along line 3-3 of FIG. 2.

As shown in FIG. 3, each semiconductor device 21, 31 is a bare chip. First electrodes (lands) 22, 32 are respectively formed on the lower surfaces of the semiconductor devices 21, 31. Each of the semiconductor devices 21, 31 has an upper surface on the side opposite to the corresponding one of the first electrodes 22, 32. Second electrodes (lands) 23, 33 are respectively formed on the upper surfaces of the semiconductor devices 21, 31. Hereinafter, one of the semiconductor devices 21, 31 will be referred to as a first semiconductor device 21 and the other one of the semiconductor devices 21, 31 will be referred to as a second semiconductor device 31. The first semiconductor device 21 is an insulated gate bipolar transistor (IGBT). The first electrode 22 of the first semiconductor device 21 is a collector electrode and the second electrode 23 is an emitter electrode. The first semiconductor device 21 includes a non-illustrated gate electrode. The second semiconductor device 31 is a diode. The first electrode 32 of the second semiconductor device 31 is a cathode electrode and the second electrode 33 is an anode electrode.

The wiring trace 14 is joined to the first electrode 22 of the first semiconductor device 21. The wiring trace 15 is joined to the first electrode 32 of the second semiconductor device 31. The wiring traces 14, 15 are thus electrically connected to the semiconductor devices 21, 31, respectively.

As shown in FIGS. 1 and 2, the semiconductor module 10 includes a housing 41 made of plastic. The housing 41 includes a rectangular frame body 42 including four side walls 43, 44. Among the four side walls 43, 44, the two side walls 43, which are opposed to each other in the X-direction, are referred to as first side walls 43, and the two side walls 44, which are opposed to each other in the Y-direction, are referred to as second side walls 44. The housing 41 includes a beam 45, which bridges the two first side walls 43. The housing 41 includes openings 46, 47 on the opposite sides of the beam 45. The housing 41 is arranged on the upper surface of the insulating substrate 12. As viewed in the Z-direction, the beam 45 is located between the first semiconductor device 21 and the second semiconductor device 31. The Z-direction coincides with the thickness direction of the insulating substrate 12.

As shown in FIG. 3, the semiconductor module 10 includes a plate-shaped bus bar 51. The bus bar 51 is formed by bending a metal plate. The bus bar 51 includes an extension 52, bent portions 55, 56, and upright portions 57, 58. The extension 52 includes a flat rectangular plate-shaped coupling portion 53 and a projection 54, which projects from the coupling portion 53. The coupling portion 53 includes two surfaces arranged in the thickness direction of the coupling portion 53 and two side faces extending in directions crossing the corresponding surfaces. The projection 54 projects from one of the side faces of the coupling portion 53 and extends in an upward direction, which is the thickness direction of the coupling portion 53. The bus bar 51 has a symmetrical structure with respect to the center in the longitudinal direction of the coupling portion 53.

The bent portions 55, 56 are arranged at the opposite ends of the coupling portion 53. The bent portions 55, 56 extend continuously with the coupling portion 53. The bus bar 51 is bent at a right angle at the bent portions 55, 56. The upright portions 57 and 58 extend continuously with the bent portions 55 and 56, respectively. The upright portions 57, 58 extend in the thickness direction of the coupling portion 53 and in a downward direction on the opposite side to the projection 54.

Figure 4:
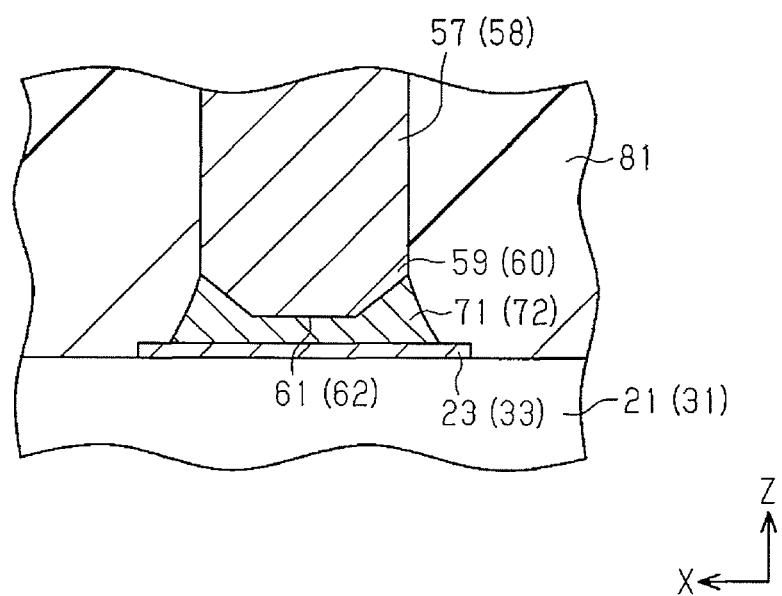
FIG. 4 is a cross-sectional view taken along line 4-4 of FIG. 3.

As shown in FIG. 4, the bus bar 51 also has end portions 59, 60, which extend continuously with the upright portions 57, 58. The end portions 59, 60 are chamfered. As a result, the width, which is the dimension in the X-direction, of each of the end portions 59, 60, becomes smaller toward a corresponding distal end face 61, 62. FIG. 4 shows the cross sections of the upright portion 57 and the end portion 59. The cross-sectional shapes of the upright portion 58 and the end portion 60 are identical to the cross-sectional shapes of the upright portion 57 and the end portion 59. Therefore, the upright portions 57, 58 and the end portions 59, 60 will be described with reference to FIG. 4.

The distal end face 61 of the end portion 59 faces the second electrode 23 of the first semiconductor device 21. The distal end face 62 of the end portion 60 faces the second electrode 33 of the second semiconductor device 31. The end portion 59 is joined to the second electrode 23 of the first semiconductor device 21 by a solder joint 71. The end portion 60 is joined to the second electrode 33 of the second semiconductor device 31 by a solder joint 72. That is, the bus bar 51 includes the multiple end portions 59, 60, which are joined to the semiconductor devices 21, 31. The solder joints 71, 72 are solder fillets expanding from the distal end faces 61, 62 toward the second electrodes 23, 33. The solder joints 71, 72 are joint portions that join the end portion 59, 60 to the semiconductor device 21, 31. The distal end faces 61, 62 of the end portions 59, 60 extend in a direction crossing the opposite surfaces of the bus bar 51 and perpendicular to the thickness direction of the insulating substrate 12.

As illustrated in FIG. 3, by joining the end portions 59, 60 of the bus bar 51 to the semiconductor devices 21, 31, the upright portions 57, 58 are arranged upright in the Z-direction. The bus bar 51 is bent at the bent portions 55, 56 in a direction crossing the thickness direction of the insulating substrate 12 with respect to the upright portions 57, 58. In this case, the bus bar 51 is bent at the bent portions 55, 56 in the Y-direction, which is perpendicular to the thickness direction of the insulating substrate 12. The projection 54 extends to be spaced from the insulating substrate 12 and projects to the outside of the housing 41.

As shown in FIG. 1, part of the extension 52 is embedded in the housing 41. That is, the part of the coupling portion 53 on which the projection 54 is arranged and the basal end of the projection 54 are embedded in the beam 45. The coupling portion 53 extends through the beam 45 in the Y-direction. The coupling portion 53, which is part of the extension 52, thus projects from end faces 45a of the beam 45 into the inner sides of the openings 46, 47. Each of the end faces 45a of the beam 45 is a surface defining the corresponding one of the openings 46, 47. The coupling portion 53 extends continuously in the two openings 46, 47. The projection 54 projects from an upper surface of the beam 45 to the outside of the housing 41.

By embedding part of the extension 52, the bus bar 51 is integrated with the housing 41. The extension 52 is the entire bus bar 51 except for the end portions 59, 60, the upright portions 57, 58, and the bent portions 55, 56.

As viewed in the Z-direction, the upright portions 57, 58 and the bent portions 55, 56 are arranged on a line connecting the solder joints 71, 72 to each other. In the configuration in which the upright portions 57, 58 and the bent portions 55, 56 are all embedded in the beam 45, the beam 45 is arranged to be overlapped with the solder joints 71, 72 as viewed in the Z-direction. In the present embodiment, since only the extension 52 is embedded in the beam 45, the beam 45 is arranged without being overlapped with the solder joints 71, 72 as viewed in the Z-direction. In this case, as viewed in the Z-direction, the openings 46 and 47 are arranged above the solder joints 71 and 72, respectively. That is, each of the openings 46, 47 is arranged at a position corresponding to one of the solder joints 71, 72.

As shown in FIGS. 3 and 4, the internal space of the housing 41 is sealed using potting resin 81. The potting resin 81 is omitted in FIGS. 1 and 2 for illustrative purposes.

Operation of the semiconductor module 10 of the present embodiment will now be described.

In a process of manufacturing the semiconductor module 10, cream solder is applied onto the second electrodes 22, 33 of the semiconductor devices 21, 31. The bus bar 51 is then positioned such that the end portions 59, 60 of the bus bar 51 are arranged on the cream solder. At this time, the housing 41 is positioned to determine the position of the bus bar 51, which is integrated with the housing 41. Then, after joining the end portions 59, 60 of the bus bar 51 to the semiconductor devices 21, 31 with the solder joints 71, 72, the potting resin 81 before curing is poured into the housing 41. At this time, before sealing with plastic is performed, the joint state between each semiconductor device 21, 31 and the bus bar 51 is checked by seeing the corresponding solder joint 71, 72. In this case, each opening 46, 47 is arranged at a position corresponding to the corresponding solder joint 71, 72. This allows visual checking of the joint state between each semiconductor device 21, 31 and the bus bar 51 through the corresponding opening 46, 47 of the housing 41. That is, the housing 41 includes the openings 46, 47 for visual checking of the joint state between each semiconductor device 21, 31 and the bus bar 51.

The above described embodiment achieves the following advantages.

(1) Since the bus bar 51 and the housing 41 are integrated with each other, the housing 41 is attached to the wiring substrate 11 by joining the bus bar 51 to the semiconductor devices 21, 31. In the present embodiment, the housing 41 has the openings 46, 47 for visual checking. Therefore, even after the housing 41 is attached to the wiring substrate 11, the solder joints 71, 72 can be seen to check the joint state between each semiconductor device 21, 31 and the bus bar 51.

(2) For example, if the coupling portion 53 extends through both upper and lower surfaces of the beam 45, the coupling portion 53 must have a length including an extra amount corresponding to the dimensions of the parts of the coupling portion 53 that extend through the beam 45 in the vertical direction. However, if the coupling portion 53 extends through the beam 45 to project from the end faces 45a as in the present embodiment, size enlargement of the semiconductor module 10 in the vertical direction is limited.

(3) The bus bar 51 includes the end portions 59, 60, which are joined to the semiconductor devices 21, 31. This simplifies the configuration of the semiconductor module 10, compared to a case in which bus bars are arranged independently to be joined to the semiconductor devices 21, 31. Also, by using the common bus bar 51, the number of components is reduced.

(4) For example, by bending each end portion 59, 60 of the bus bar 51 in a transverse direction with respect to the upright portion 57, 58, the surface of the end portions 59, 60 may be joined to the respective second electrodes 23, 33. However, in the present embodiment, the bus bar 51 is joined to the semiconductor devices 21, 31 with the distal end faces 61, 62 of the bus bar 51 facing the second electrodes 23, 33 of the semiconductor devices 21, 31. This reduces the surface area of each section of the bus bar 51 that is joined to the corresponding semiconductor device 21, 31. Specifically, the surface area of the second electrode (land) 23, 33 of each semiconductor device 21, 31 is determined in correspondence with the surface area of each section of the bus bar 51 that is joined to the semiconductor device 21, 31. Therefore, by reducing the surface area of the part of the bus bar 51 joined to each second electrode 23, 33, size enlargement of the second electrode 23, 33 is restrained.

(5) Since the end portions 59, 60 of the bus bar 51 are chamfered, the width of each end portion 59, 60 becomes smaller toward the corresponding distal end face 61, 62. This configuration reduces the surface area of each distal end face 61, 62, compared to a case in which the end portions 59, 60 are formed without chamfering. When the distal end faces 61, 62 are arranged to face the corresponding second electrodes 23, 33, each distal end face 61, 62 is positioned to be opposed, as a whole, to the corresponding second electrode 23, 33. In this case, by reducing the size of each distal end face 61, 62, arrangement of the distal end face 61, 62 as a whole in a manner to be opposed to the second electrode 23, 33 is facilitated. This absorbs errors that exceed the tolerance at the time of positioning the housing 41.

(6) The part of the coupling portion 53 on which the projection 54 is arranged and the basal end of the projection 54 are embedded in the beam 45. When force is applied to the projection 54, the force is received by the boundary between the projection 54 and the coupling portion 53. However, in the present embodiment, the boundary between the projection 54 and the coupling portion 53 is embedded in the beam 45. This restrains bending of the projection 54 about the boundary between the projection 54 and the coupling portion 53 as a base point. Also, since the projection 54 resists bending, reactive force acting on each semiconductor device 21, 31 and the corresponding solder joint 71, 72 is restrained. Further, when force is transmitted to the coupling portion 53, reactive force is attenuated by each bent portion 55, 56. This also restrains reactive force acting on each semiconductor device 21, 31 and the corresponding solder joint 71, 72.

(7) Since the end portions 59, 60 of the bus bar 51 are chamfered, each solder joint 71, 72 is easily formed as a solder fillet.

(8) The projection 54 of the bus bar 51 projects to the outside of the housing 41. In this configuration, at the time of assembling a power module such as an inverter device, the number of parasitic devices is reduced by establishing connections using wiring traces or bus bars without using bonding wires.

The present embodiment may be modified in the following manners.

The first electrode 22 of the first semiconductor device 21 is a collector electrode, and the second electrode 23 is an emitter electrode. However, the first semiconductor device 21 may be arranged face-down so that the front and back surfaces of the first semiconductor device 21 are reversed with respect to the wiring substrate 11.

Although the bus bar 51 is bent at a right angle, the bus bar 51 may be bent at a blunt angle or an acute angle.

The end portions 59, 60 of the bus bar 51 may be joined to the wiring traces 14, 15. Alternatively, some end portions 59, 60 of multiple end portions 59, 60 may be joined to the semiconductor devices 21, 31, and the other end portions 59, 60 may be joined to the wiring traces 14, 15.

Figure 5:
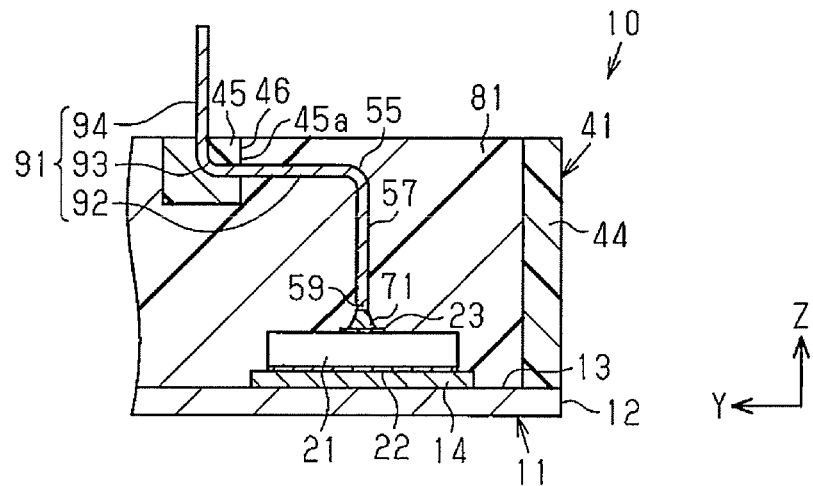
FIG. 5 is a partial cross-sectional view showing a semiconductor module of a modification.

As illustrated in FIG. 5, only one of the end portions 59, 60 may be joined to the corresponding semiconductor device 21, 31 or the corresponding wiring trace 14, 15. That is, any configuration may be employed as long as at least one of the end portions 59, 60 of the bus bar 51 is joined to the corresponding semiconductor device 21, 31 or the corresponding wiring trace 14, 15.

Figure 6:
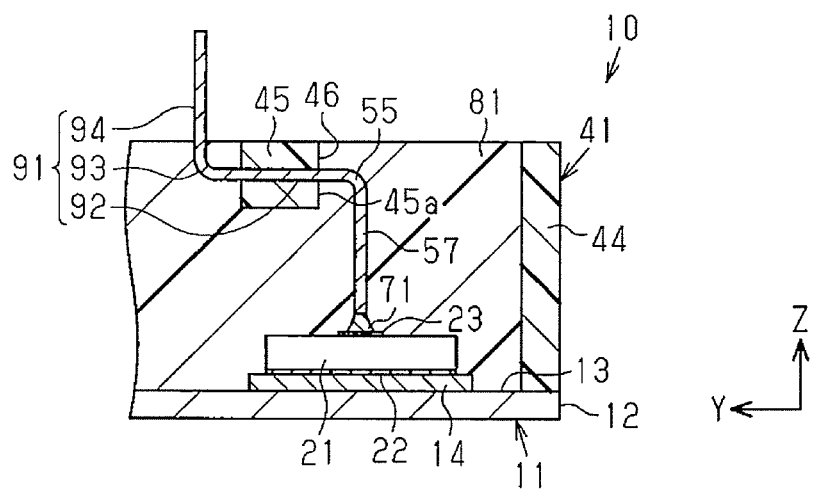
FIG. 6 is a partial cross-sectional view showing a semiconductor module of another modification.

As shown in FIG. 5, an extension 91 may include a coupling portion 92, a bent portion 93, and a projection 94. The bent portion 93 extends continuously with the coupling portion 92. The bus bar 51 is bent at the bent portion 93 and then projects to the outside of the housing 41. The projection 94 is the part of the bus bar 51 that projects to the outside of the housing 41. In this case, by embedding the bent portion 93 in the housing 41, reactive force acting on the semiconductor device 21, 31 is restrained. Alternatively, as illustrated in FIG. 6, the coupling portion 92 may be embedded in the housing 41.

Figure 7:
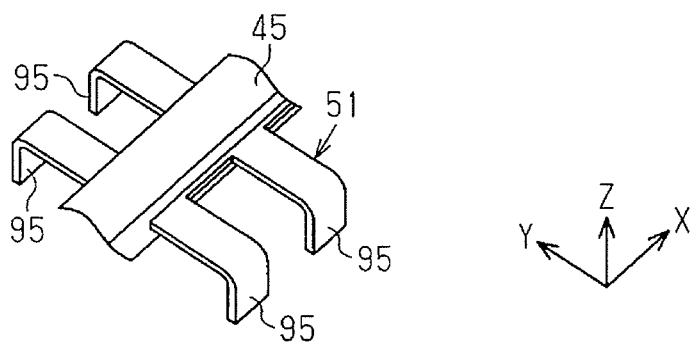
FIG. 7 is a partial perspective view showing a bus bar of a modification.

As illustrated in FIG. 7, the bus bar 51 may have three or more end portions 95, which are joined to the semiconductor devices 21, 31 or the wiring traces 14, 15.

The projection 54 may be omitted. That is, the bus bar 51 may be configured in any manner as long as the bus bar 51 includes at least a section at which the semiconductor devices 21, 31 are connected together, a section at which the wiring traces 14, 15 are connected together, and a section at which each semiconductor device 21, 31 and the corresponding wiring trace 14, 15 are connected together.

The end portions 59, 60, which are sections that should be soldered, do not necessarily have to be chamfered. That is, the width of each end portion 59, 60 does not necessarily have to become smaller toward the corresponding distal end face 61, 62.

Each end portion 59, 60 of the bus bar 51 may be bent in a manner crossing the corresponding upright portion 57, 58 at a right angle. In this case, surfaces of the end portions 59, 60 of the bus bar 51 are joined to the corresponding second electrodes 23, 33.

The extension 52 of the bus bar 51 may be embedded in the side walls 43, 44 of the housing 41. In this case, the beam 45 of the housing 41 may be omitted.

The extension may extend through the beam 45 in the vertical direction.

Each semiconductor device may be a MOSFET or the like.

The number of beams may be changed as needed in correspondence with the number of bus bars or the like.

The extension 52 may be embedded in the housing 41.

The number of semiconductor devices 21, 31 and the number of wiring traces 14, 15 may be changed as needed.

In addition to the rectangular shape, the frame body 42 may have a different polygonal shape or a circular shape.

The potting resin 81 of the semiconductor module 10 may be omitted.

The openings 46, 47 may be arranged at any positions as long as the solder joints 71, 72 can be visually checked. For example, each opening 46, 47 may be arranged at any position as long as the position is at least slightly offset from the position at which the opening 46, 47 is overlapped with the corresponding solder joint 71, 72 as viewed in the Z-direction. That is, a position corresponding to each solder joint 71, 72 (the joint portion) is a position at which the solder joint 71, 72 can be visually checked through the corresponding opening 46, 47.

Each joint portion may be any conductive material other than solder, such as silver paste.

Figure 8:
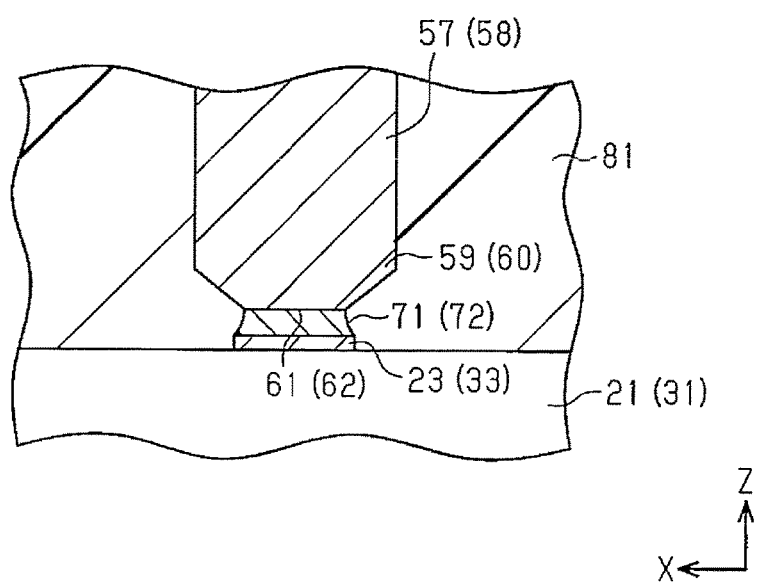
FIG. 8 is a partial cross-sectional view showing an end portion of a bus bar of another modification.

As illustrated in FIG. 8, the width of each second electrode 23, 33 may be, for example, smaller than the width of the part with the maximum width of the corresponding end portion 59, 60 of the bus bar 51. In this case, by chamfering each end portion 59, 60 of the bus bar 51, the width of each distal end face 61, 62 can be reduced compare to the width of the part with the maximum width of the end portion 59, 60. The bus bar 51 thus can be joined to the second electrodes 23, 33.

The invention claimed is:

1. A semiconductor module comprising:
  a wiring substrate having a wiring trace arranged on an insulating substrate;
  a semiconductor device connected to the wiring trace;
  a plate-shaped bus bar having at least one end portion joined to the wiring trace or the semiconductor device; and
  a plastic housing having a frame body surrounding the wiring trace and the semiconductor device, the frame body including two side walls that are opposed to each other and a beam that bridges the two side walls, the bus bar being integrated with the housing, wherein
  the bus bar includes
    an upright portion that extends upright from the end portion in a thickness direction of the insulating substrate,
    a bent portion that extends continuously with the upright portion and bends the bus bar in a direction crossing the thickness direction, and
    an extension that extends continuously with the bent portion and has a section embedded in the beam, and
  the housing includes an opening for visual checking at a position corresponding to a joint portion between the end portion of the bus bar and the wiring trace or the semiconductor device.

2. The semiconductor module according to claim 1, wherein the bus bar projects from an end face of the beam that defines the opening to an inner side of the opening.

3. The semiconductor module according to claim 1, wherein the bus bar has a plurality of ends that is joined to the wiring trace or the semiconductor device.

4. The semiconductor module according to claim 1, wherein the end portion of the bus bar has a distal end face that faces the wiring trace or the semiconductor device.

5. The semiconductor module according to claim 4, wherein a width of the end portion of the bus bar becomes smaller toward the distal end face.

6. The semiconductor module according to claim 1, wherein the extension includes a flat rectangular plate-shaped coupling portion and a projection, which projects from a side surface of the coupling portion,
  the upright portion extends in the thickness direction of the coupling portion and in a direction on the opposite side to the projection,
  the projection extends to be spaced from the insulating substrate and projects to the outside of the housing, and
  the part of the coupling portion on which the projection is arranged and the basal end of the projection are embedded in the beam.

7. The semiconductor module according to claim 6, wherein the opening is one of two openings,
  the coupling portion projects from end faces of the beam,
  each of the end faces is a surface defining the corresponding one of the two openings,
  the coupling portion extends continuously in the two openings and extends into the inner sides of the two openings, and
  the bent portions are arranged at the opposite ends of the coupling portion.

* * * * *